United States Patent
Yokoyama

(10) Patent No.: US 8,300,421 B2
(45) Date of Patent: Oct. 30, 2012

(54) ELECTRONIC COMPONENT AND METHOD OF MANUFACTURING ELECTRONIC COMPONENT

(75) Inventor: Yasuo Yokoyama, Kahoku-gun (JP)

(73) Assignee: Murata manufacturing Co., Ltd., Kyoto (JP)

( * ) Notice: Subject to any disclaimer, the term of this patent is extended or adjusted under 35 U.S.C. 154(b) by 310 days.

(21) Appl. No.: 12/788,507

(22) Filed: May 27, 2010

(65) Prior Publication Data
US 2010/0315795 A1    Dec. 16, 2010

(30) Foreign Application Priority Data
Jun. 10, 2009    (JP) ................. 2009-139061

(51) Int. Cl.
H05K 7/02    (2006.01)
H05K 7/06    (2006.01)
H05K 7/08    (2006.01)
H05K 7/10    (2006.01)

(52) U.S. Cl. ........ 361/760; 361/767; 361/772; 174/259; 174/260; 174/264

(58) Field of Classification Search .......... 174/259–264; 361/767–772; 29/832–840
See application file for complete search history.

(56) References Cited

U.S. PATENT DOCUMENTS
4,883,920 A * 11/1989 Tanabe et al. ................. 174/263

FOREIGN PATENT DOCUMENTS
| JP | 2000-269628 A | 9/2000 |
| JP | 2005-347660 A | 12/2005 |
| JP | 2006-173256 A | 6/2006 |

OTHER PUBLICATIONS
Official Communication issued in corresponding Chinese Patent Application No. 2009-139061, mailed on Aug. 30, 2011.

* cited by examiner

Primary Examiner — Tuan T Dinh
(74) Attorney, Agent, or Firm — Keating & Bennett, LLP

(57) ABSTRACT

An electronic component and a method of manufacturing an electronic component including a first surface mount device and a second surface mount device are provided. The first surface mount device and the second surface mount device are joined to a substrate via joint materials such that either or both of the first and second surface mount devices are shifted from the locations corresponding to land electrodes located on the substrate so as to be aligned with each other and are subjected to a reflow process. The outer land electrodes are formed at locations shifted inwardly from the locations corresponding to a virtual arrangement state in which the first surface mount device and the second surface mount device are arranged in series such that an end surface of the first surface mount device is in contact with an end surface of the second surface mount device.

3 Claims, 7 Drawing Sheets

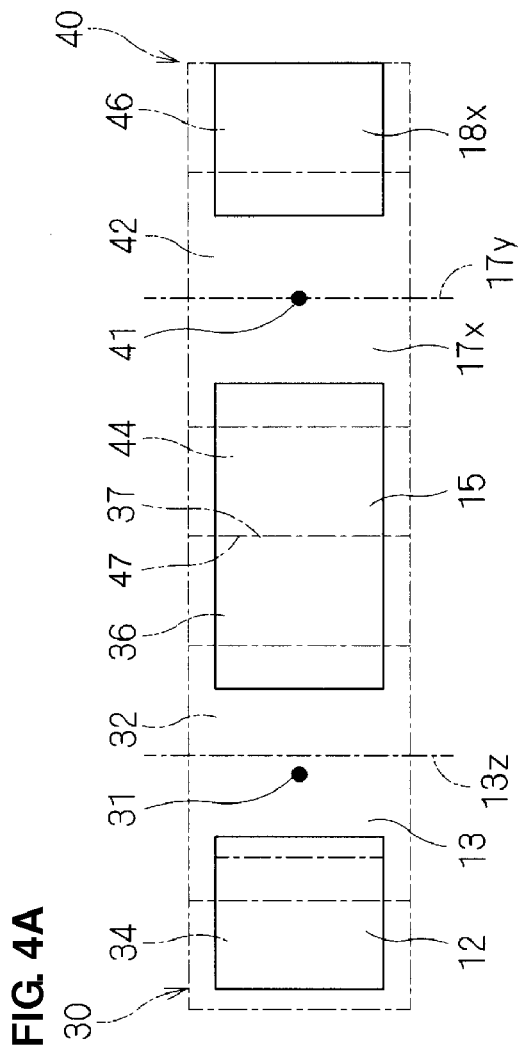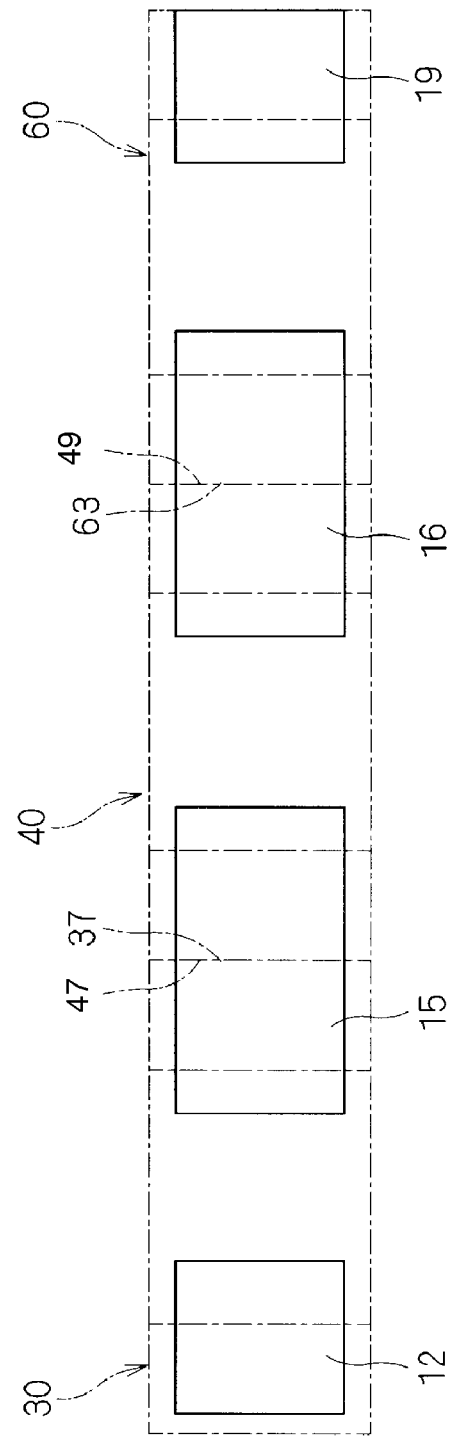

ELECTRONIC COMPONENT AND METHOD OF MANUFACTURING ELECTRONIC COMPONENT

BACKGROUND OF THE INVENTION

1. Field of the Invention

The present invention relates to methods of manufacturing electronic components. More particularly, the present invention relates to a method of manufacturing an electronic component including chip surface mount devices including electrodes at both ends thereof. The chip surface mount devices are mounted on a substrate in a state in which the chip surface mount devices are arranged in series.

2. Description of the Related Art

Methods of manufacturing electronic components are known in which surface mount devices are mounted on substrates by performing a reflow process after the surface mount devices are installed on the substrates.

Mounting the surface mount devices so as to be in contact with each other by using the manufacturing methods using the reflow process has been proposed.

For example, FIG. 5 shows an example in which surface mount devices 101 and 102 are installed on a substrate 103. The surface mount device 101 is installed on the substrate 103 so that the locations of solder bumps 107 provided on electrodes 101b of the surface mount device 101 are shifted from land electrodes 104 on the substrate 103, and the surface mount device 102 is installed on the substrate 103 so that the locations of the solder bumps 107 provided on electrodes 102b of the surface mount device 102 are shifted from land electrodes 105 on the substrate 103.

Then, the surface mount devices are put through a reflow oven. When the surface mount devices are subjected to the reflow process, a main body 101a of the surface mount device 101 and a main body 102a of the surface mount device 102 are moved so as to be close to each other due to the surface tension of the solder bumps 107 that are melted by the heating, as shown by arrows in FIG. 6.

As a result, as shown in FIG. 7, the surface mount devices 101 and 102 are fixed on the substrate 103 with solders 106 sandwiched therebetween in a state in which an end surface of the surface mount device 101 is in contact with an end surface of the surface mount device 102 (for example, refer to Japanese Unexamined Patent Application Publication No. 2005-347660).

An electronic component can be manufactured by the following method, in which chip surface mount devices each including electrodes at both ends thereof are mounted on a substrate in a state in which the chip surface mount devices are arranged in series.

FIGS. 1A to 1C are cross-sectional views schematically showing an example of a process of manufacturing an electronic component 10x in a reference example.

Specifically, as shown in the cross-sectional view in FIG. 1A, joint materials 22, 24, 26, and 28, such as cream solder, are applied on land electrodes 12x, 15, and 18x that are formed on a substrate 11 so as to be aligned with each other. Then, as shown in FIG. 1B, first and second surface mount devices 30 and 40 of a chip type are installed on the substrate 11 so as to be spaced apart from each other. The first surface mount device 30 includes electrodes 34 and 36 at both ends of its main body 32 and the second surface mount device 40 includes electrodes 44 and 46 at both ends of its main body 42. Then, the first and second surface mount devices 30 and 40 are put through a reflow oven to melt the joint materials 22, 24, 26, and 28. A force that moves the first and second surface mount devices 30 and 40 so as to be close to each other is applied to the first and second surface mount devices 30 and 40 due to the surface tension of the joint materials 22, 24, 26, and 28, as shown by arrows 38 and 48 in FIG. 1B. As a result, as shown in FIG. 1C, the first and second surface mount devices 30 and 40 are moved due to the reflow oven and, therefore, it is possible to manufacture the electronic component 10x in which the first and second surface mount devices 30 and 40 are mounted in a state in which the first surface mount device 30 is closer to the second surface mount device 40, as compared to the state before the reflow.

However, since the electrodes 36 and 44 are also formed on end surfaces 37 and 47 of the first and second chip surface mount devices 30 and 40, respectively, a joint material 25 is suctioned upward due to the capillary action so as to enter a region between the end surface 37 of the first surface mount device 30 and the end surface 47 of the second surface mount device 40, which are opposed to each other, as shown in FIG. 1C. As a result, a gap 50 is formed between the end surface 37 of the first surface mount device 30 and the end surface 47 of the second surface mount device 40, which are opposed to each other.

Narrowing the gap 50 between the end surface 37 of the first surface mount device 30 and the end surface 47 of the second surface mount device 40 enables the electronic component 10x to be reduced in size.

SUMMARY OF THE INVENTION

To overcome the problems described above, preferred embodiments of the present invention provide a method of manufacturing an electronic component in which a smaller gap is formed between chip surface mount devices mounted on a substrate in a state in which the chip surface mount devices are arranged in series.

According to a preferred embodiment of the present invention, a method of manufacturing an electronic component is provided and includes the following steps.

The method according to this preferred embodiment of the present invention is used to manufacture an electronic component in which a first surface mount device and a second surface mount device that each include electrodes at both ends thereof and that are chip type devices are arranged on a substrate in series. The method includes the steps of installing the first surface mount device and the second surface mount device on the substrate via joint materials such that either or both of the first surface mount device and the second surface mount device are shifted from the locations corresponding to land electrodes formed on the substrate so as to be aligned with each other and fixing the first surface mount device and the second surface mount device on the substrate in a state in which either or both of the first surface mount device and the second surface mount device, which are shifted from the locations corresponding to the land electrodes formed on the substrate, are close to the locations corresponding to the land electrodes formed on the substrate by heating the first surface mount device and the second surface mount device installed on the substrate via the joint materials to melt the joint materials, and cooling the first surface mount device and the second surface mount device to solidify the joint materials. Among the land electrodes formed on the substrate so as to be aligned with each other, the remaining land electrodes excluding the land electrode at one end or the land electrodes at both ends are formed at the locations corresponding to the electrodes of the first surface mount device and the second surface mount device in a virtual arrangement state in which the first surface mount device and the second surface mount device are arranged in series such that an end surface of the first surface mount device is in contact with an end surface of the second surface mount device, and the land electrode at the one end or the land electrodes at both ends are formed at locations that are shifted from the locations corresponding to the electrodes of the first surface mount device and the second surface mount device in the virtual arrangement state toward the remaining land electrodes.

The first surface mount device and the second surface mount device are installed on the substrate via the joint materials, such as bumps provided on the electrodes or paste materials applied to the substrate, in the installing step.

The surface mount devices shifted from the locations corresponding to the land electrodes attempt to move toward the locations corresponding to the land electrodes due to the surface tension of the molten joint materials in the fixing step. At this time, the surface mount device installed on the land electrodes shifted toward the remaining land electrodes attempts to move toward the remaining surface mount device over the location at which the end surfaces of the surface mount devices are in contact with each other.

Accordingly, a force that is caused by the melting of the joint materials and that causes the first surface mount device and the second surface mount device to be close to each other becomes greater than that in the case in which all of the land electrodes are formed at the locations corresponding to the virtual arrangement state in which the first surface mount device and the second surface mount device are arranged in series such that the end surface of the first surface mount device is in contact with the end surface of the second surface mount device. As a result, the first surface mount device and the second surface mount device are fixed on the substrate in a state in which the first surface mount device is closer to the second surface mount device.

The land electrodes preferably include a common land electrode to which a land electrode of the first surface mount device and the adjacent land electrode of the second surface mount device are connected, for example.

In this case, the distance between the end surfaces of the adjacent surface mount devices is decreased even with the common land electrode.

According to another preferred embodiment of the present invention, an electronic component is provided which has the following configuration.

The electronic component according to this preferred embodiment of the present invention includes a first surface mount device and a second surface mount device that each include electrodes at both ends thereof and that are chip type devices, the first surface mount device and the second surface mount device being arranged in series, a substrate, and land electrodes that are arranged on the substrate so as to be aligned with each other and that are connected to the electrodes of the first surface mount device and the second surface mount device. Among the land electrodes arranged on the substrate so as to aligned with each other, the remaining land electrodes excluding the land electrode at one end or the land electrodes at both ends are arranged at the locations corresponding to the electrodes of the first surface mount device and the second surface mount device in a virtual arrangement state in which the first surface mount device and the second surface mount device are arranged in series such that an end surface of the first surface mount device is in contact with an end surface of the second surface mount device, and the land electrode at the one end or the land electrodes at both ends are arranged at locations that are shifted from the locations corresponding to the electrodes of the first surface mount device and the second surface mount device in the virtual arrangement state toward the remaining land electrodes.

With the above-described configuration, the first surface mount device and the second surface mount device are arranged in series on the substrate in a state in which the end surface of the first surface mount device is closer to the end surface of the second surface mount device, as compared to the case in which all the land electrodes are arranged at the locations corresponding to the virtual arrangement state in which the first surface mount device and the second surface mount device are arranged in series such that the end surface of the first surface mount device is in contact with the end surface of the second surface mount device.

According to various preferred embodiments of the present invention, it is possible to narrow the gap to the greatest extent possible between the chip surface mount devices mounted on the substrate so as to be arranged in series.

These and other features, elements, characteristics and advantages of the present invention will become more apparent from the following detailed description of preferred embodiments of the present invention with reference to the attached drawings.

BRIEF DESCRIPTION OF THE DRAWINGS

FIG. 4A shows an example of the configuration of an electronic component according to a first modification of the preferred embodiment shown in FIGS. 3A to 3C and FIG. 4B shows an example of the configuration of an electronic component according to a second modification of the preferred embodiment shown in FIGS. 3A to 3C.

DETAILED DESCRIPTION OF THE PREFERRED EMBODIMENTS

Preferred embodiments of the present invention will herein be described with reference to FIGS. 2A to 4B.

Comparative Example

Figure 1A:
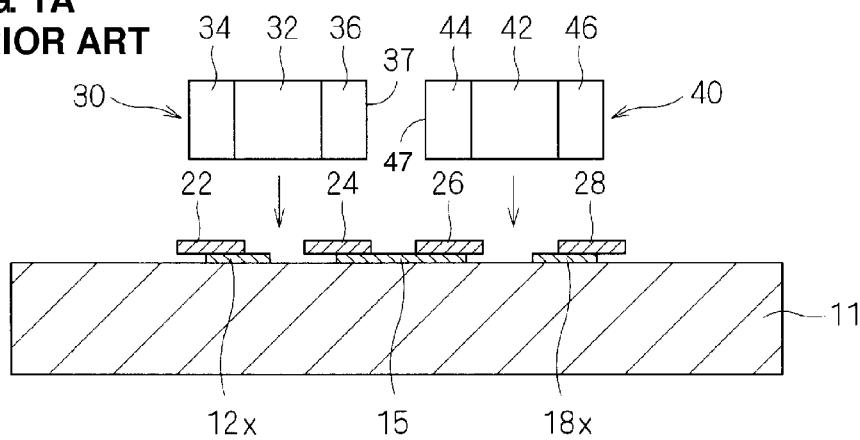
FIGS. 1A to 1C show an example of a process of manufacturing an electronic component in a reference example.
Figure 1B:
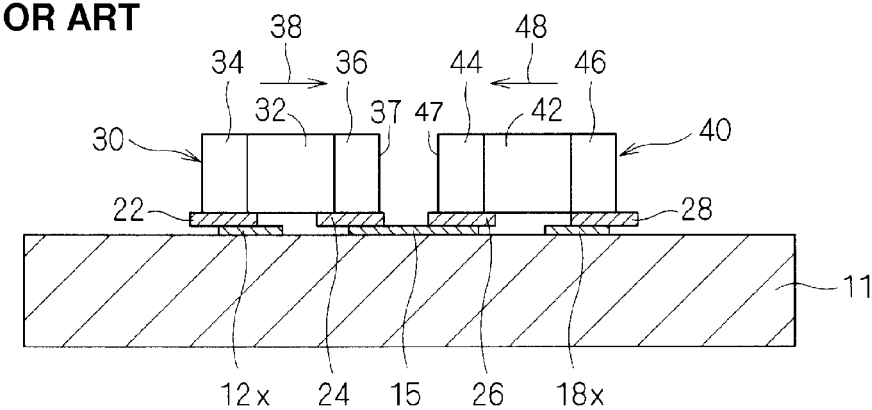
Figure 1C:
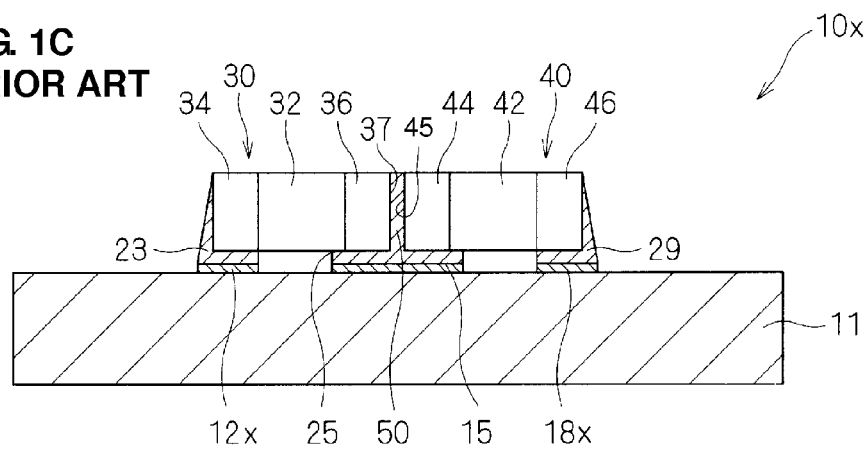
Figure 2A:
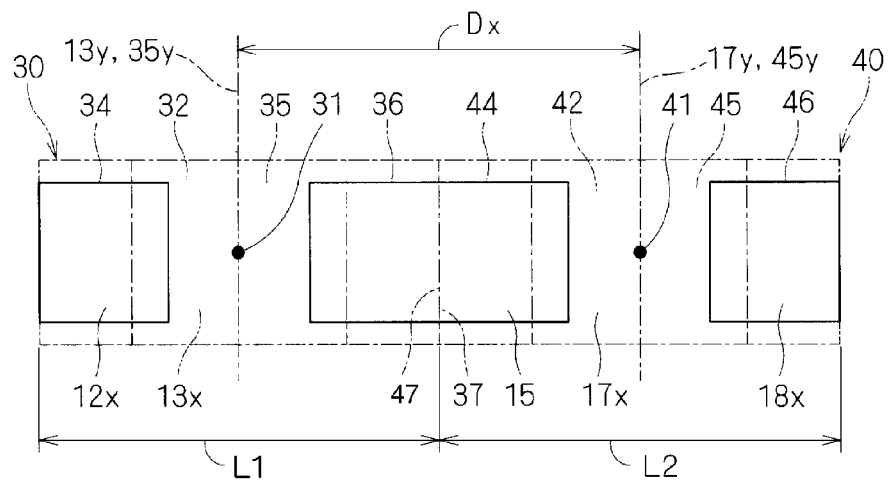
FIGS. 2A to 2C show an example of a process of manufacturing an electronic component according to a comparative example.
Figure 2B:
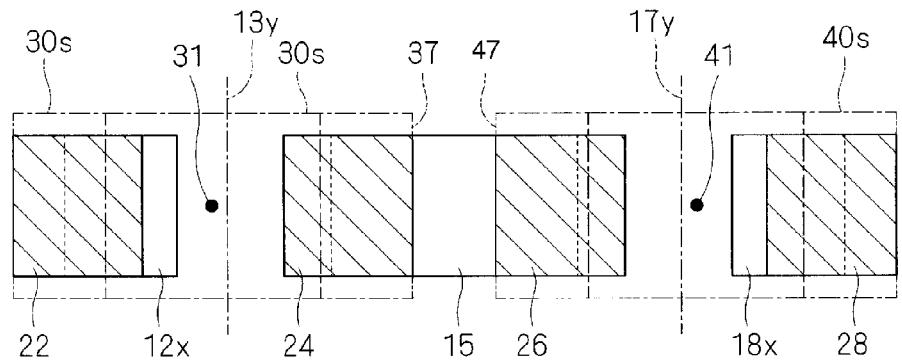
Figure 2C:
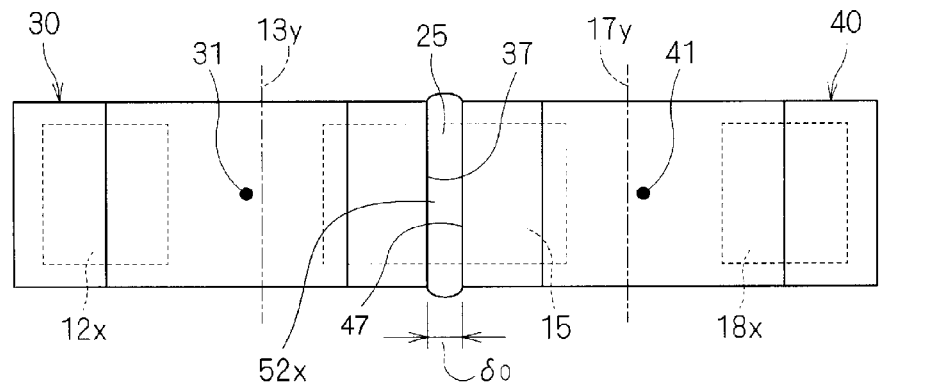

FIGS. 2A to 2C show a process of manufacturing an electronic component 10x according to a comparative example.

Referring to FIG. 2A, in the electronic component 10x according to the comparative example, all of the land electrodes 12x, 15, and 18x formed on a substrate so as to be aligned to each other are formed at the locations corresponding to a virtual arrangement state in which first and second chip-type surface mount devices 30 and 40 are arranged in series such that an end surface 37 of the first surface mount device 30 is in contact with an end surface 47 of the second surface mount device 40. Specifically, in the example in FIG. 2A, alternate long and short dash lines indicate the virtual arrangement state in which the first and second chip surface mount devices 30 and 40 are arranged in series such that the end surface 37 of the first surface mount device 30 is in contact with the end surface 47 of the second surface mount device 40. The first surface chip mount device 30 includes electrodes 34 and 36 at both ends of a main body 32, and the second chip surface mount device 40 includes electrodes 44 and 46 at both ends of a main body 42. Solid lines indicate the land electrodes 12x, 15, and 18x formed at the locations on the substrate corresponding to the electrodes 34, 36, 44, and 46 of the first and second surface mount devices 30 and 40 in the virtual arrangement state shown by the alternate long and short dash lines.

As shown in FIG. 2A, in a perspective view from a direction perpendicular to the substrate, a central line 13y of an area 13x between the land electrodes 12x and 15 connected to the electrodes 34 and 36, respectively, at both ends of the first surface mount device 30 coincides or substantially coincides with a central line 35y of an area 35 between the electrodes 34 and 36 at both ends of the first surface mount device 30. Since the first chip surface mount device 30 has a symmetrical configuration, a center 31 of the first surface mount device 30 is on the central line 13y of the area 13x between the land electrodes.

Similarly, a central line 17y of an area 17x between the land electrodes 15 and 18x connected to the electrodes 44 and 46, respectively, at both ends of the second surface mount device 40 coincides or substantially coincides with a central line 45y of an area 45 between the electrodes 44 and 46 at both ends of the second surface mount device 40. Since the second chip surface mount device 40 has a symmetrical configuration, a center 41 of the second surface mount device 40 is on the central line 17y of the area 17x between the land electrodes.

A distance Dx between the central line 13y of the area 13x between the land electrodes and the central line 17y of the area 17x between the land electrodes is calculated according to Equation (1):

$$Dx = (L1+L2)/2 \qquad (1)$$

where "L1" denotes the length of the first surface mount device 30 and "L2" denotes the length of the second surface mount device 40, because the distance between the center 31 of the first surface mount device 30 and the center 41 of the second surface mount device 40 in the virtual arrangement state is equal to "(L1+L2)/2".

When the first and second surface mount devices 30 and are installed on the substrate in the virtual arrangement state using a device installation apparatus, the first surface mount device 30 may collide against the second surface mount device 40 because of a variation in the installation locations of the first and second surface mount devices 30 and 40. Accordingly, the first and second surface mount devices 30 and 40 are installed on the substrate so as to be spaced apart from their locations corresponding to the virtual arrangement state, as shown by alternate long and short dash lines 30s and 40s in FIG. 2B.

For example, when the first and second surface mount devices 30 and 40 are 0603-sized chip devices, the first and second surface mount devices 30 and 40 are installed such that the distance between the end surface 37 and the end surface 47 opposing the end surface 37 is equal to about 100 μm to about 200 μm.

Joint materials 22, 24, 26, and 28 are arranged on the substrate in advance at the locations corresponding to the electrodes 34, 36, 44, and 46, respectively, of the first and second surface mount devices 30 and 40 to be installed, and the first and second surface mount devices 30 and 40 are installed on the joint materials 22, 24, 26, and 28.

When the first and second surface mount devices 30 and 40 are put through the reflow oven to be heated after the first and second surface mount devices 30 and 40 are installed on the substrate in a state in which the first and second surface mount devices 30 and 40 are shifted from the locations corresponding to the virtual arrangement state, the joint materials 22, 24, 26, and 28 are melted. The first and second surface mount devices 30 and 40 are supported on the substrate via the molten joint materials 22, 24, 26, and 28 and the molten joint materials 22, 24, 26, and 28 expand on the land electrodes 12x, 15, and 18x. Accordingly, a force (hereinafter referred to as a "driving force") that causes the first and second surface mount devices 30 and 40 to be moved toward the locations corresponding to the balanced virtual arrangement state is applied to the first and second surface mount devices 30 and 40 due to the surface tension of the molten joint materials 22, 24, 26, and 28 to move the first and second surface mount devices 30 and 40 so as to be close to each other.

However, when the end surface 37 of the first surface mount device 30 moves close to the end surface 47 of the second surface mount device 40, which is opposed to the end surface 37, a joint material 25 enters the gap between the end surfaces 37 and 47, as shown in FIG. 2C. Since the driving force caused by the surface tension of the molten joint materials is reduced as the first and second surface mount devices 30 and 40 get close to the locations corresponding to the virtual arrangement state, it is not possible to completely displace the molten joint material that has entered between the end surface 37 of the first surface mount device 30 and the end surface 47 of the second surface mount device 40. Consequently, the first and second surface mount devices 30 and 40 cannot be moved to the locations corresponding to the virtual arrangement state in which the end surface 37 of the first surface mount device 30 is in contact with the end surface 47 of the second surface mount device 40, thus forming a gap 52x between the end surface 37 of the first surface mount device 30 and the end surface 47 of the second surface mount device 40.

For example, when the first and second surface mount devices 30 and 40 are 0603-sized chip capacitors, a dimension $\delta_0$ of the gap 52x is equal to about 10 μm to about 30 μm.

Figure 3A:
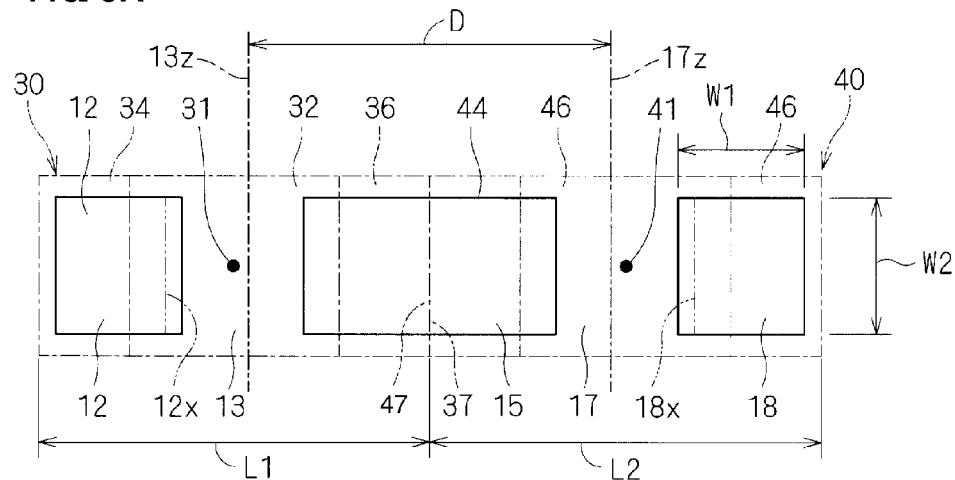
FIGS. 3A to 3C show an example of a process of manufacturing an electronic component according to a preferred embodiment of the present invention.
Figure 3B:
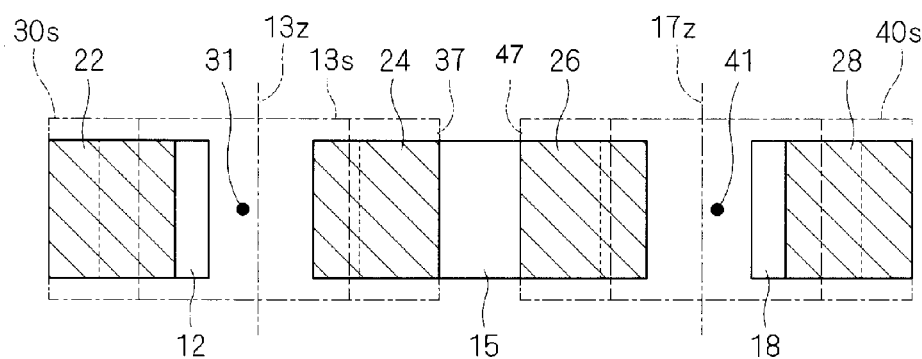
Figure 3C:
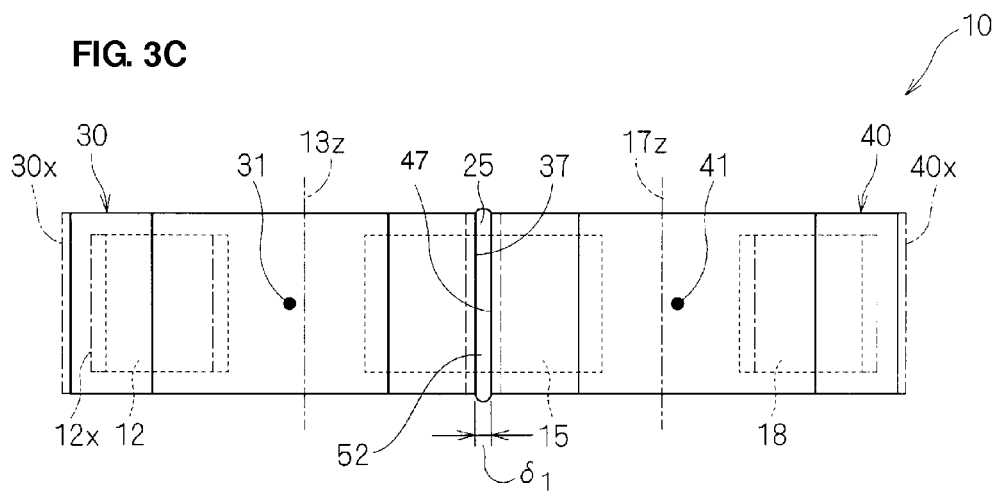
Figure 5:
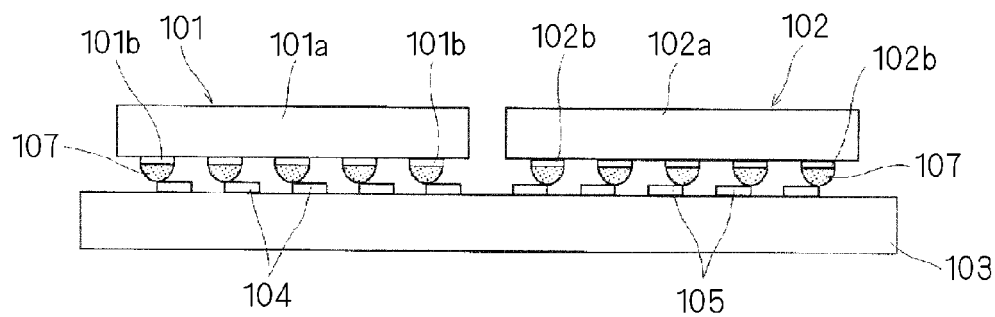
FIG. 5 shows an example of a process of manufacturing an electronic component in related art.
Figure 6:
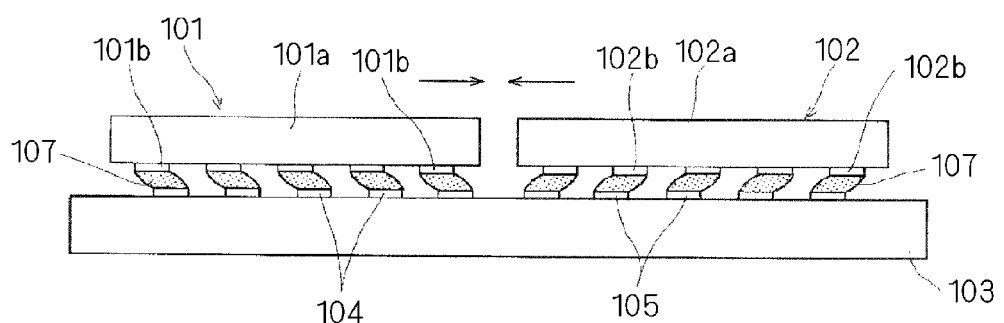
FIG. 6 shows the example of the process of manufacturing the electronic component in the related art.
Figure 7:
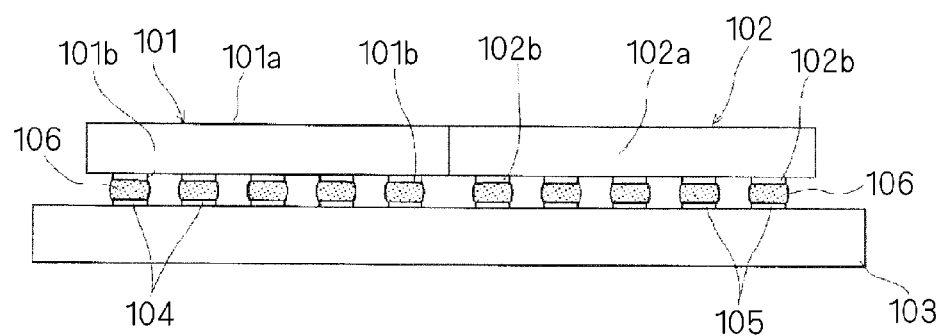
FIG. 7 shows the example of the process of manufacturing the electronic component in the related art.

FIGS. 3A to 3C show an example of a process of manufacturing an electronic component 10 according to a preferred embodiment of the present invention.

In the electronic component 10 of the present preferred embodiment, the land electrodes 12 and 18 at both ends, that is, at the outer sides, among the land electrodes 12, 15, and 18 formed on a substrate so as to be aligned with each other, are shifted inwardly, that is, toward the remaining land electrode 15.

As shown in FIG. 3A, the land electrodes 12 and 18 at both ends are shifted inwardly from the locations corresponding to the virtual arrangement state (denoted by alternate long and two short dash lines) in which the first and second surface mount devices 30 and 40 are arranged in series such that the end surface 37 of the first surface mount device 30 is in contact with the end surface 47 of the second surface mount device 40.

Accordingly, as shown in FIG. 3A, in a perspective view from a direction perpendicular to the substrate, a central line 13z of an area 13 between the land electrodes 12 and 15 connected to the electrodes 34 and 36, respectively, at both ends of the first surface mount device 30 is shifted from the center 31 of the first surface mount device 30 toward the second surface mount device 40. A central line 17z of an area 17 between the land electrodes 15 and 18 connected to the electrodes 44 and 46, respectively, at both ends of the second surface mount device 40 is shifted from the center 41 of the second surface mount device 40 toward the first surface mount device 30.

A distance D between the central line 13z of the area 13 between the land electrodes and the central line 17z of the area 17 between the land electrodes is represented according to Expression (2):

$$D < (L1+L2)/2 \qquad (2)$$

where "L1" denotes the length of the first surface mount device 30 and "L2" denotes the length of the second surface mount device 40, because the distance between the center 31 of the first surface mount device 30 and the center 41 of the second surface mount device 40 is equal to "(L1+L2)/2".

For example, the land electrodes 12, 15, and 18 preferably made of, for example, sintered metal, such as copper (Cu) or silver (Ag), are formed on the substrate made of ceramics. The land electrodes 12, 15, and 18 may be subjected to plating. When the first and second surface mount devices 30 and 40 are chip surface mount devices, such as 0603-sized chip capacitors, for example, a width W1 of the land electrodes 12 and 18 is set to about 200 μm and a length W2 thereof is set to about 250 μm, for example. The land electrodes 12 and 18 are preferably shifted inwardly from the locations corresponding to the virtual arrangement state by about 50 μm, for example.

After the joint materials 22, 24, 26, and 28, which are shaded, are arranged on the substrate, the first and second surface mount devices 30 and 40 are installed at the locations denoted by the alternate long and short dash line 30s and 40s, as shown in FIG. 3B.

For example, when the first and second surface mount devices 30 and 40 are 0603-sized chip devices, the first and second surface mount devices 30 and 40 are preferably installed at locations shifted outwardly from the locations corresponding to the virtual arrangement state by about 50 μm to about 100 μm, for example.

The joint materials 22, 24, 26, and 28 are arranged so as to be matched with the locations at which the first and second surface mount devices 30 and 40 are installed, shown by the alternate long and short dash lines 30s and 40s. Specifically, the joint materials 22, 24, 26, and 28 are preferably arranged such that the joint materials 22, 24, 26, and 28 are in contact with any of the electrodes 34, 36, 44, and 46 of the first and second surface mount devices 30 and 40 and at least a portion of the joint materials 22, 24, 26, and 28 is superposed on the land electrodes 12, 15, and 18. The joint materials 22, 24, 26, and are arranged, for example, by applying solder paste on the substrate via a metal mask. It is preferable that the joint materials 22 and 28 be superposed on the land electrodes 12 and 18, respectively, by an amount greater than one-fourth of the width of the land electrodes 12 and 18 because the movement of the first and second surface mount devices 30 and 40 due to the reflow is stabilized in this case.

The substrate on which the first and second surface mount devices 30 and 40 are installed is heated in the reflow oven to melt the joint materials 22, 24, 26, and 28 and is cooled. The melting of the joint materials 22, 24, 26, and 28 by the heating causes the first and second surface mount devices 30 and 40 to be moved so as to be close to each other due to the surface tension of the joint materials 22, 24, 26, and 28.

Since the outer land electrodes 12 and 18, among the land electrodes 12, 15, and 18 formed so as to be aligned with each other, are shifted inwardly, the driving force that moves the first and second surface mount devices 30 and 40 to balanced locations over the locations corresponding to the virtual arrangement state is applied to the first and second surface mount devices 30 and 40. Specifically, the driving force that moves the first surface mount device 30 so that the center 31 of the first surface mount device 30 is on the central line 13z of the area 13 between the land electrodes 12 and 15 is applied to the first surface mount device 30. The driving force that moves the second surface mount device 40 so that the center 41 of the second surface mount device 40 is on the central line 17z of the area 17 between the land electrodes 15 and 18 is applied to the second surface mount device 40. Accordingly, the driving force applied when the end surface 37 of the first surface mount device 30 and the end surface 47 of the second surface mount device 40 are moved by the same amount so as to be closer to each other is greater than that when all of the land electrodes are formed at the locations corresponding to the virtual arrangement state, as in the example in FIGS. 2A to 2C. Consequently, the first and second surface mount devices 30 and 40 are closer to each other even when the molten joint material enters between the end surface 37 of the first surface mount device 30 and the end surface 47 of the second surface mount device 40.

As a result, as shown in FIG. 3C, in the electronic component 10 in which the first and second surface mount devices and 40 are mounted on the substrate, even if a gap 52 is formed between the end surface 37 of the first surface mount device 30 and the end surface 47 of the second surface mount device 40, a dimension $\delta_1$ of the gap 52 is smaller than the dimension $\delta_0$ of the gap 52x between the first and second surface mount devices 30 and 40 in the example in FIG. 2C.

Although the land electrode 15 is commonly used for the electrode 36 of the first surface mount device 30 and the electrode 44 of the second surface mount device 40, which have the same voltage and which have no problem even if the electrode and the electrode 44 are short circuited, separate land electrodes may be provided for the electrodes 36 and 44. The use of the common land electrode 15 causes the molten joint material to be more likely to enter between the end face 37 of the first surface mount device 30 and the end surface 47 of the second surface mount device 40, which is opposed to the end surface 37, and the gap between the end surfaces 37 and 47 is likely to widen, as compared to the case in which separate land electrodes are used for the electrodes 36 and 44. However, even in such a case, it is possible to decrease the dimension $\delta_1$ of the gap 52 between the first and second surface mount devices 30 and 40 by shifting the outer land electrodes 12 and 18 inwardly.

FIG. 4A shows a first modification of a preferred embodiment of the present invention. In the case in FIG. 4A, only one land electrode 12, among the outer land electrodes 12 and 18x in the land electrodes 12, 15, and 18x formed so as to be aligned with each other, is shifted inwardly.

In FIG. 4A, since the driving force that moves the first surface mount device 30 toward the second surface mount device 40 over the location corresponding to the virtual arrangement state is applied to the first surface mount device 30 in which the land electrode 12 is shifted due to the reflow, it is possible to narrow the gap between the first and second surface mount devices 30 and 40, as compared to the case in which all of the land electrodes are formed at the locations corresponding to the virtual arrangement state.

FIG. 4B shows a second modification of a preferred embodiment of the present invention. When three or more surface mount devices including surface mount devices 30, 40 and 60 are arranged in series as shown in FIG. 4B, both of the outer land electrodes 12 and 19 or only the land electrode 12, among the land electrodes 12, 15, 16, and 19 formed so as to be aligned with each other, is shifted inwardly from the location corresponding to the virtual arrangement state (denoted by alternate long and short dash lines) in which the surface mount devices 30, 40 and 60 are arranged such that the end surface 37 of the surface mount device 30 is in contact with the end surface 47 of the surface mount device 40 and an end surface 49 of the surface mount device 40 is in contact with an end surface 63 of the surface mount device 60.

In FIG. 4B, since the driving force that moves the surface mount device 30 toward the surface mount device 40 over the location corresponding to the virtual arrangement state is applied to the surface mount device 30 in which the land electrode 12 is shifted due to the reflow, it is possible to narrow the gap between the surface mount devices 30 and 40, as compared to the case in which all the land electrodes are formed at the locations corresponding to the virtual arrangement state.

As described above, shifting inwardly the land electrode at one end or the land electrodes at both ends, among the land electrodes formed so as to be aligned with each other, enables the gap between the chip surface mount devices mounted on the substrate in the state in which the chip surface mount devices are arranged in series to be narrowed as much as possible.

It will be further understood by those skilled in the art that the present invention is not limited to the preferred embodiments and the modifications described above and that various changes and modifications may be made to the present invention without departing from the spirit and scope thereof.

For example, joint materials, such as solder bumps, may be provided on the electrodes of the surface mount devices, instead of the arrangement of the joint materials, such as solder paste, on the substrate. In such a case, the surface mount devices are installed on the substrate such that the joint materials, such as solder bumps, are in contact with the land electrodes and, then, the surface mount devices are subjected to the reflow process.

While preferred embodiments of the invention have been described above, it is to be understood that variations and modifications will be apparent to those skilled in the art without departing from the scope and spirit of the present invention. The scope of the invention, therefore, is to be determined solely by the following claims.

What is claimed is:

1. A method of manufacturing an electronic component in which a first surface mount device and a second surface mount device that each includes electrodes at both sides and that are chip devices are arranged in series on a substrate, the method comprising the steps of:
    installing the first surface mount device and the second surface mount device on the substrate via joint materials such that either one or both of the first surface mount device and the second surface mount device are shifted from locations corresponding to land electrodes formed on the substrate so as to be aligned with each other; and
    fixing the first surface mount device and the second surface mount device on the substrate in a state in which either one or both of the first surface mount device and the second surface mount device, which are shifted from the locations corresponding to the land electrodes formed on the substrate, are close to the locations corresponding to the land electrodes formed on the substrate by heating the first surface mount device and the second surface mount device installed on the substrate via the joint materials to melt the joint materials and cooling the first surface mount device and the second surface mount device to solidify the joint materials; wherein
    among the land electrodes formed on the substrate so as to aligned with each other, remaining land electrodes excluding the land electrode at one end or the land electrodes at both ends are formed at locations corresponding to the electrodes of the first surface mount device and the second surface mount device in a virtual arrangement state in which the first surface mount device and the second surface mount device are arranged in series such that an end surface of the first surface mount device is in contact with an end surface of the second surface mount device; and
    the land electrode at the one end or the land electrodes at both ends are formed at locations that are shifted from the locations corresponding to the electrodes of the first surface mount device and the second surface mount device in the virtual arrangement state toward the remaining land electrodes.

2. The method of manufacturing an electronic component according to claim 1, wherein the land electrodes include a common land electrode to which one of the electrodes of the first surface mount device and one of the electrodes of the second surface mount device adjacent to the one of the electrodes of the first surface mount device are connected.

3. An electronic component comprising:
    a first surface mount device and a second surface mount device each including electrodes at both ends and that are chip devices, the first surface mount device and the second surface mount device being arranged in series;
    a substrate; and
    land electrodes arranged on the substrate so as to be aligned with each other and connected to the electrodes of the first surface mount device and the second surface mount device; wherein
    among the land electrodes provided on the substrate so as to be aligned with each other, remaining land electrodes excluding the land electrode at one end or the land electrodes at both ends are arranged at locations corresponding to the electrodes of the first surface mount device and the second surface mount device in a virtual arrangement state in which the first surface mount device and the second surface mount device are arranged in series such that an end surface of the first surface mount device is in contact with an end surface of the second surface mount device; and
    the land electrode at the one end or the land electrodes at both ends are arranged at locations that are shifted from the locations corresponding to the electrodes of the first surface mount device and the second surface mount device in the virtual arrangement state toward the remaining land electrodes.

* * * * *